US011292939B2

(12) United States Patent
Iwano et al.

(10) Patent No.: US 11,292,939 B2
(45) Date of Patent: Apr. 5, 2022

(54) POLISHING LIQUID, POLISHING LIQUID SET AND POLISHING METHOD

(71) Applicant: HITACHI CHEMICAL COMPANY, LTD., Tokyo (JP)

(72) Inventors: Tomohiro Iwano, Tokyo (JP); Takaaki Matsumoto, Tokyo (JP); Tomomi Kukita, Tokyo (JP); Tomoyasu Hasegawa, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/981,573

(22) PCT Filed: Mar. 20, 2019

(86) PCT No.: PCT/JP2019/011872
§ 371 (c)(1),
(2) Date: Sep. 16, 2020

(87) PCT Pub. No.: WO2019/182063
PCT Pub. Date: Sep. 26, 2019

(65) Prior Publication Data
US 2021/0071037 A1    Mar. 11, 2021

(30) Foreign Application Priority Data

Mar. 22, 2018  (WO) ................. PCT/JP2018/011464
Jul. 26, 2018   (WO) ................. PCT/JP2018/028105
Sep. 25, 2018  (WO) ................. PCT/JP2018/035458

(51) Int. Cl.
*C09G 1/02* (2006.01)
*H01L 21/304* (2006.01)
*H01L 21/3105* (2006.01)
*B24B 37/04* (2012.01)
*C09K 13/06* (2006.01)
*B24B 1/00* (2006.01)
*C09G 1/06* (2006.01)
*H01L 21/306* (2006.01)
*C09K 3/14* (2006.01)
*C09G 1/04* (2006.01)
*C09G 1/00* (2006.01)
*H01L 21/321* (2006.01)

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/14* (2013.01); *C09K 3/1454* (2013.01); *C09K 3/1463* (2013.01); *C09K 13/06* (2013.01); *H01L 21/304* (2013.01); *H01L 21/30625* (2013.01); *H01L 21/31053* (2013.01); *H01L 21/31055* (2013.01); *H01L 21/3212* (2013.01)

(58) Field of Classification Search
None
See application file for complete search history.

(56) References Cited

U.S. PATENT DOCUMENTS

| 5,543,126 A | 8/1996 | Ota |
| 6,939,211 B2 | 9/2005 | Taylor |
| 2004/0065022 A1 | 4/2004 | Machii |
| 2004/0152309 A1 | 8/2004 | Carter |
| 2005/0119360 A1 | 6/2005 | Kawakami |
| 2007/0044385 A1 | 3/2007 | Yamada |
| 2011/0275285 A1 | 11/2011 | Satou |
| 2012/0100718 A1 | 4/2012 | Minami |
| 2012/0129346 A1 | 5/2012 | Ryuzaki |
| 2012/0299158 A1 | 11/2012 | Shinoda |
| 2013/0161285 A1 | 6/2013 | Li |
| 2015/0140904 A1 | 5/2015 | Iwano |
| 2016/0024351 A1 | 1/2016 | Yoshida |
| 2016/0108284 A1 | 4/2016 | Yoshizaki |
| 2016/0137881 A1 | 5/2016 | Oota |
| 2016/0319159 A1 | 11/2016 | Minami |
| 2017/0183537 A1 | 6/2017 | Yoon |
| 2017/0183538 A1 | 6/2017 | Kwon |
| 2017/0292039 A1 | 10/2017 | Sato |
| 2018/0043497 A1* | 2/2018 | Hanano .................... C09G 1/02 |
| 2018/0072917 A1 | 3/2018 | Kobayashi |
| 2019/0211245 A1 | 7/2019 | Choi |

(Continued)

FOREIGN PATENT DOCUMENTS

| CN | 103189457 | 7/2013 |
| CN | 103339219 | 10/2013 |
| CN | 104334675 | 2/2015 |

(Continued)

OTHER PUBLICATIONS

A. Soult, "13.1 Amino Acid", in Chemistry LibreTexts, from Chem.Libretext.org, printed on May 19, 2021 (Year: 2021).*
"Wikipedia, "N-vinylpyrrolidone" via https://en.wikipedia.org/wiki/N-Vinylpyrrolidone", 2020, p. 1-p. 3 (cited in Office Action dated Mar. 9, 2021 in U.S. Appl. No. 16/981,589).
"Wikipedia, "Poly(N-vinylacetamide)" via https://en.wikipedia.org/wiki/Poly(N-vinylacetamide)", 2019, p. 1-p. 2 (cited in Office Action dated Mar. 9, 2021 in U.S. Appl. No. 16/981,589).
"Wikipedia, "Polyethylene glycol" via https://en.wikipedia.org/wiki/Polyethylene_glycol", 2021, p. 1-p. 11 (cited in Office Action dated Mar. 9, 2021 in U.S. Appl. No. 16/981,589).

(Continued)

*Primary Examiner* — Jiong-Ping Lu
(74) *Attorney, Agent, or Firm* — Fitch, Even, Tabin & Flannery, L.L.P.

(57) ABSTRACT

According to an aspect of the present invention, there is provided a polishing liquid containing abrasive grains, a hydroxy acid, a polyol, at least one zwitterionic compound selected from the group consisting of an aminocarboxylic acid and an aminosulfonic acid, and a liquid medium, in which a zeta potential of the abrasive grains is positive, an isoelectric point of the aminocarboxylic acid is smaller than 7.0, and pKa of the aminosulfonic acid is larger than 0.

19 Claims, No Drawings

(56) References Cited

U.S. PATENT DOCUMENTS

2019/0256742 A1      8/2019    Suzuki

FOREIGN PATENT DOCUMENTS

| | | | |
|---|---|---|---|
| CN | 105895518 | 8/2016 | |
| CN | 108010878 | 5/2018 | |
| JP | H8-022970 A | 1/1996 | |
| JP | H10-106994 A | 4/1998 | |
| JP | 2005513765 | 5/2005 | |
| JP | 2006249129 | 9/2006 | |
| JP | 2007318072 | 12/2007 | |
| JP | 2008112990 | 5/2008 | |
| JP | 2009290188 | 12/2009 | |
| JP | 2010153781 | 7/2010 | |
| JP | 2011518098 | 6/2011 | |
| JP | 4941430 | 5/2012 | |
| JP | 2012-186339 A1 | 9/2012 | |
| JP | 2013-540851 A | 11/2013 | |
| JP | 201593932 | 5/2015 | |
| JP | 2015-137297 A | 7/2015 | |
| JP | 2016-029123 A | 3/2016 | |
| JP | 2016-538359 A | 12/2016 | |
| JP | 201752858 | 3/2017 | |
| JP | 2017-203076 A | 11/2017 | |
| JP | 2018-044046 A | 3/2018 | |
| KR | 101737938 | 5/2017 | |
| TW | 201518489 | 5/2015 | |
| TW | 201518492 | 5/2015 | |
| TW | 201525118 | 7/2015 | |
| TW | 201610126 | 3/2016 | |
| TW | 201816060 | 5/2018 | |
| WO | 97029510 | 8/1997 | |
| WO | 02067309 | 8/2002 | |
| WO | 2008146641 | 12/2008 | |
| WO | 2009131133 | 10/2009 | |
| WO | 2010143579 | 12/2010 | |
| WO | 2012070541 | 5/2012 | |
| WO | 2012070542 | 5/2012 | |
| WO | 2012070544 | 5/2012 | |
| WO | 2013125441 | 8/2013 | |
| WO | 2014/208414 A1 | 12/2014 | |
| WO | 2014199739 | 12/2014 | |
| WO | 2015/052988 A1 | 4/2015 | |
| WO | 2015/098197 A1 | 7/2015 | |
| WO | 2016/006553 A1 | 1/2016 | |
| WO | WO2016143797 * | 9/2016 | ............... C09G 1/02 |
| WO | 201743139 | 3/2017 | |
| WO | 2018012174 | 1/2018 | |
| WO | 2018048068 | 3/2018 | |

OTHER PUBLICATIONS

"Wikipedia, "Tartaric acid" via https://en.wikipedia.org/wiki/Tartaric_acid", 2021, p. 1-p. 9 (cited in Office Action dated Mar. 9, 2021 in U.S. Appl. No. 16/981,589).

International Search Report dated Dec. 11, 2018, for International Application No. PCT/JP2018/035456, together with English language translation.

Written Opinion of the International Searching Authority dated Dec. 11, 2018, for International Application No. PCT/JP2018/035456, together with English language translation.

International Search Report dated Aug. 1, 2019, for International Application No. PCT/JP2018/035441, together with English language translation.

Written Opinion of the International Searching Authority dated Aug. 1, 2019, for International Application No. PCT/JP2018/035441, together with English language translation.

International Search Report dated Dec. 25, 2018, for International Application No. PCT/JP2018/035443, together with English language translation.

Written Opinion of the International Searching Authority dated Dec. 25, 2018, for International Application No. PCT/JP2018/035443, together with English language translation.

International Search Report dated Aug. 1, 2019, for International Application No. PCT/JP2018/035463, together with English language translation.

Written Opinion of the International Searching Authority dated Aug. 1, 2019, for International Application No. PCT/JP2018/035463, together with English language translation.

International Search Report dated Sep. 24, 2019, for International Application No. PCT/JP2019/028712, together with English language translation.

Written Opinion of the International Searching Authority dated Sep. 27, 2019, for International Application No. PCT/JP2019/028712, together with English language translation.

"Glyceric acid," https://en.wikipedia.org/wiki/Glyceric_acid, 2021, p. 1-p. 2 (Cited in Office Action dated May 10, 2021 in U.S. Appl. No. 16/981,589).

"Glycolic Acid," https://en.wikipedia.org/wiki/Glycolic_acid, 2021, p. 1-p. 5 (Cited in Office Action dated May 10, 2021 in U.S. Appl. No. 16/981,589).

"Lactic acid," https://en.wikipedia.org/wiki/Lactic_acid, 2021, p. 1-p. 11 (Cited in Office Action dated May 10, 2021 in U.S. Appl. No. 16/981,589).

Merrian Webster, Definition of "have," https://www.merriam-webster.com/dictionary/have, 2021, p. 1-p. 14 (Cited in Office Action dated May 10, 2021 in U.S. Appl. No. 16/981,589).

* cited by examiner

POLISHING LIQUID, POLISHING LIQUID SET AND POLISHING METHOD

CROSS-REFERENCE TO RELATED APPLICATIONS

This application is a U.S. national phase application filed under 35 U.S.C. § 371 of International Application No. PCT/JP2019/011872, filed Mar. 20, 2019, designating the United States, which claims priority from International Application No. PCT/JP2018/035458, filed Sep. 25, 2018, International Application No. PCT/JP2018/028105, filed Jul. 26, 2018, and International Application No. PCT/JP2018/011464, filed Mar. 22, 2018, which are hereby incorporated herein by reference in their entirety.

TECHNICAL FIELD

The present invention relates to a polishing liquid, a polishing liquid set, and a polishing method.

BACKGROUND ART

In recent years, processing techniques for increasing density and miniaturization are becoming ever more important in manufacturing steps for semiconductor elements. CMP (chemical mechanical polishing) technique that is one of processing techniques has become an essential technique in manufacturing steps for semiconductor elements, for formation of a shallow trench isolation (hereinafter, referred to as "STI"), flattening of pre-metal insulating materials or interlayer insulating materials, formation of plugs or embedded metal wirings, or the like.

As a polishing liquid most frequently used, for example, a silica-based polishing liquid containing silica (silicon oxide) particles such as fumed silica or colloidal silica as abrasive grains is exemplified. The silica-based polishing liquid is characterized by being high in general versatility, and can polish broad types of materials irrespective of insulating materials and conductive materials by appropriately selecting an abrasive grain content, a pH, an additive, or the like.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide particles as abrasive grains can polish silicon oxide at a high rate even when the abrasive grain content is lower than that in the silica-based polishing liquid (for example, see Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970

SUMMARY OF INVENTION

Technical Problem

In the CMP technique for formation of STI or the like, polishing of a laminate, which has a substrate having a concavo-convex pattern, a stopper (a polishing stop layer containing a stopper material) disposed on the convex portion of the substrate, and an insulating material (for example, silicon oxide) disposed on the substrate and the stopper to fill the concave portion of the substrate, is performed. In such polishing, polishing of the insulating material is stopped by the stopper. That is, polishing of the insulating material is stopped at a stage where the stopper is exposed. The reason for this is that the polished amount of the insulating material (for example, the film thickness of the insulating material removed in an insulating film) is difficult to artificially control, and thus the insulating material is polished until the stopper is exposed, thereby controlling the degree of polishing.

In the CMP technique, in order to avoid the insulating material from remaining on the stopper after polishing is stopped at the stage where the insulating material is polished to allow the stopper to be exposed, polishing is excessively performed even after the stopper is exposed, in some cases. This excessive polishing is called "over-polishing". In the case of performing the over-polishing, when a polishing liquid having a high polishing selectivity for an insulating material with respect to a stopper material is simply used, the insulating material other than the insulating material located on the stopper is also excessively polished. This promotes dishing (a phenomenon in which depressions (step heights) are produced in the insulating material serving as an element isolation layer or the like), and results in inferior flatness after polishing in some cases. Therefore, in the CMP technique, it is necessary to suppress excessive dishing at the time of over-polishing (excessive polishing of the insulating material (the insulating material embedded in the concave portion of the substrate) other than the insulating material located on the stopper).

In this regard, an object of the present invention is to provide a polishing liquid, a polishing liquid set, and a polishing method with which excessive dishing can be suppressed during polishing an insulating material by using a stopper.

Solution to Problem

A polishing liquid according to an aspect of the present invention contains abrasive grains, a hydroxy acid, a polyol, at least one zwitterionic compound selected from the group consisting of an aminocarboxylic acid and an aminosulfonic acid, and a liquid medium, in which a zeta potential of the abrasive grains is positive, an isoelectric point of the aminocarboxylic acid is smaller than 7.0, and pKa of the aminosulfonic acid is larger than 0.

According to such a polishing liquid, excessive dishing can be suppressed during polishing an insulating material by using a stopper. According to this, the flatness of the base substrate after the completion of over-polishing can be improved.

A polishing liquid set according to another aspect of the present invention contains constituent components of the above-described polishing liquid separately stored as a first liquid and a second liquid, in which the first liquid comprises the abrasive grains and a liquid medium, and the second liquid comprises the hydroxy acid, the polyol, the zwitterionic compound, and a liquid medium. According to such a polishing liquid set, the same effect as that of the polishing liquid described above can be obtained.

A polishing method according to another aspect of the present invention includes a polishing step of polishing a surface to be polished by using the above-described polishing liquid or a polishing liquid obtained by mixing the first liquid and the second liquid of the above-described polishing liquid set. According to such a polishing method, the same effect as that of the polishing liquid described above can be obtained.

Advantageous Effects of Invention

According to the present invention, excessive dishing can be suppressed during polishing an insulating material by using a stopper.

According to the present invention, it is possible to provide use of the polishing liquid in polishing of a surface to be polished containing silicon oxide. According to the present invention, it is possible to provide use of the polishing liquid in selective polishing of silicon oxide with respect to silicon nitride. According to the present invention, it is possible to provide use of the polishing liquid in a flattening step of a base substrate surface that is the manufacturing technology of semiconductor elements. According to the present invention, it is possible to provide use of a polishing liquid in a flattening step of STI insulating materials, pre-metal insulating materials, or interlayer insulating materials.

DESCRIPTION OF EMBODIMENTS

Hereinafter, embodiments of the present invention will be described in detail. However, the present invention is not limited to the following embodiments.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specified. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

In the present specification, the term "polishing liquid" (abrasive) is defined as a composition to be brought into contact with a surface to be polished, at the time of polishing. The term "polishing liquid" itself does not limit any components contained in the polishing liquid. As described later, a polishing liquid of the present embodiment contains abrasive grains. While the abrasive grains are also referred to as "polishing particles" (abrasive particles), it is referred to as "abrasive grains" in the present specification. The abrasive grains are generally solid particles, and it is considered that a subject to be removed is removed by a mechanical action (physical action) of the abrasive grains and a chemical action of the abrasive grains (mainly surfaces of the abrasive grains) at the time of polishing, but the mechanism is not limited thereto.

<Polishing Liquid and Polishing Liquid Set>

A polishing liquid of the present embodiment is, for example, a polishing liquid for CMP. A polishing liquid of the present embodiment contains abrasive grains, a hydroxy acid, a polyol, at least one zwitterionic compound selected from the group consisting of an aminocarboxylic acid and an aminosulfonic acid, and a liquid medium, in which a zeta potential of the abrasive grains is positive, an isoelectric point of the aminocarboxylic acid is smaller than 7.0, and pKa of the aminosulfonic acid is larger than 0.

According to the polishing liquid of the present embodiment, excessive dishing can be suppressed during polishing an insulating material by using a stopper. Further, according to the polishing liquid of the present embodiment, excessive polishing of the stopper at the time of over-polishing can be suppressed, and the stopper is easily removed when the stopper is removed by etching or the like after the over-polishing.

The present inventors have speculated factors exhibiting these effects as follows. However, the factors are not limited to the factors to be as follows.

That is, the hydroxy acid has an effect of easily suppressing an excessive increase in the polishing rate for the stopper material. Further, by using the hydroxy acid, the polishing of the insulating material after exposure of the stopper is suppressed, and thereby high flatness is easily obtained. Reasons for these are speculated that a functional group (a carboxyl group, a hydroxyl group, or the like) of the hydroxy acid is adsorbed to the insulating material and the stopper to coat these materials to be polished, and thereby the progress of polishing by the abrasive grains is moderated and an excessive increase in the polishing rate is easily suppressed.

It is speculated that the polyol has actions of forming a protective layer on the insulating material and easily allowing the insulating material to be polished at a suitable rate. Further, by using the polyol, the polishing of the insulating material after exposure of the stopper is suppressed, and thereby high flatness is easily obtained. Reasons for these are speculated that a hydrophilic portion of the polyol is adsorbed to the insulating material to coat the insulating material, and thereby, progress of polishing by the abrasive grains is moderated and an excessive increase in the polishing rate is easily suppressed.

The zwitterionic compound such as an aminocarboxylic acid and an aminosulfonic acid has a cationic portion (for example, an amino group) and an anionic portion (for example, a carboxyl group and a sulfonic acid group) in the same molecule. This zwitterionic compound can adhere particularly to a surface to be polished (that is, a surface of the insulating material and a surface of the stopper) at the time of over-polishing. At this time, the anionic portion adheres to the surface to be polished, and the cationic portion faces the outside with respect to the surface to be polished. In this case, the surface to be polished to which the zwitterionic compound adheres is positively charged, and thus this surface to be polished reacts against the abrasive grains having a positive zeta potential.

As a result, by using such a zwitterionic compound with use of the hydroxy acid and the polyol described above, excessive dishing and excessive polishing of the stopper caused by the action of the abrasive grains are suppressed.

Incidentally, in the present embodiment, by using such a zwitterionic compound with use of the hydroxy acid and the polyol described above, it can be suppressed that the insulating material is excessively strongly covered by the zwitterionic compound. Here, when the insulating material is polished using the stopper, the polishing of the insulating material is further advanced as compared to the stopper, and thereby slight irregularities having convex portions in which the stopper is disposed and concave portions in which the insulating material is disposed are formed. In this case, since a pressure to be applied is low in the concave portions, the zwitterionic compound adhering to the insulating material is less likely isolated, and thus the protection effect (protection effect with respect to excessive dishing) of the zwitterionic compound is maintained. On the other hand, in a case where an insulating material having a substantially flat surface to be polished (for example, a blanket wafer of an insulating material) is polished, a high pressure is applied to the surface to be polished, and thus the zwitterionic compound adhering to the insulating material is isolated. Therefore, according to the present embodiment, a desired polishing rate in the case of polishing an insulating material having a substantially flat surface to be polished can be obtained.

(Abrasive Grains)

The polishing liquid of the present embodiment contains abrasive grains having a positive zeta potential in the polishing liquid. The abrasive grains preferably contain at least one selected from the group consisting of cerium oxide (for example, ceria (cerium(IV) oxide)), silica, alumina, zirconia, yttria, and a hydroxide of a tetravalent metal element and more preferably contain cerium oxide, from the viewpoint of easily polishing an insulating material at a high polishing rate. The abrasive grains can be used singly or in combinations of two or more.

The "hydroxide of a tetravalent metal element" is a compound containing a tetravalent metal ($M^{4+}$) and at least one hydroxide ion ($OH^-$). The hydroxide of a tetravalent metal element may contain an anion (for example, a nitrate ion $NO_3^-$ and a sulfate ion $SO_4^{2-}$) other than a hydroxide ion. For example, the hydroxide of a tetravalent metal element may contain an anion (for example, a nitrate ion $NO_3^-$ and a sulfate ion $SO_4^{2-}$) bound to the tetravalent metal element. The hydroxide of a tetravalent metal element can be prepared by reacting a salt of a tetravalent metal element (metal salt) with an alkali source (base).

The hydroxide of a tetravalent metal element preferably contains cerium hydroxide (hydroxide of tetravalent cerium) from the viewpoint of easily improving the polishing rate for an insulating material. The cerium hydroxide can be prepared by reacting a cerium salt with an alkali source (base). The cerium hydroxide is preferably prepared by mixing a cerium salt with an alkali liquid (for example, alkali aqueous solution). This makes it possible to obtain particles having an extremely fine particle diameter, and easily obtain an excellent effect of reducing polishing scratches. The cerium hydroxide can be obtained by mixing a cerium salt solution (for example, cerium salt aqueous solution) with alkali liquid. Examples of cerium salt include $Ce(NO_3)_4$, $Ce(SO_4)_2$, $Ce(NH_4)_2(NO_3)_6$, $Ce(NH_4)_4(SO_4)_4$.

It is considered that particles including $Ce(OH)_aX_b$ (in the formula, $a+b \times c = 4$) made of tetravalent cerium ($Ce^{4+}$), one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Examples of the anions ($X^{c-}$) include $NO_3^-$ and $SO_4^{2-}$. It is considered that the particles containing cerium hydroxide can contain not only $Ce(OH)_aX_b$ but also $Ce(OH)_4$, $CeO_2$, or the like.

The containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

In a case where the abrasive grains contain cerium oxide, the lower limit of the content of the cerium oxide is preferably 50% by mass or more, more preferably more than 50% by mass, further preferably 60% by mass or more, particularly preferably 70% by mass or more, extremely preferably 80% by mass or more, and highly preferably 90% by mass or more, on the basis of the whole abrasive grains (the whole abrasive grains contained in the polishing liquid; the same applies hereinafter), from the viewpoint of easily improving the polishing rate for an insulating material.

The lower limit of the average particle diameter of the abrasive grains in the polishing liquid or a slurry of the polishing liquid set described later is preferably 16 nm or more, more preferably 20 nm or more, further preferably 30 nm or more, particularly preferably 40 nm or more, extremely preferably 50 nm or more, highly preferably 100 nm or more, even more preferably 120 nm or more, more preferably 150 nm or more, and further preferably 155 nm or more, from the viewpoint of easily improving the polishing rate for an insulating material. The upper limit of the average particle diameter of the abrasive grains is preferably 1050 nm or less, more preferably 1000 nm or less, further preferably 800 nm or less, particularly preferably 600 nm or less, extremely preferably 500 nm or less, highly preferably 400 nm or less, even more preferably 300 nm or less, more preferably 200 nm or less, and further preferably 160 nm or less, from the viewpoint of easily suppressing scratches at a polished surface. From these viewpoints, the average particle diameter of the abrasive grains is more preferably 16 to 1050 nm and further preferably 20 to 1000 nm.

The "average particle diameter" of the abrasive grains means an average secondary particle diameter of the abrasive grains. For example, the average particle diameter of the abrasive grains is the volume average particle diameter, and it can be measured, for the polishing liquid or the slurry of the polishing liquid set described later, using an optical diffraction scattering particle size distribution meter (for example, trade name: Microtrac MT3300EXII manufactured by MicrotracBEL Corp.).

The zeta potential (surface potential) of the abrasive grains in the polishing liquid is positive (the zeta potential exceeds 0 mV) from the viewpoint of suppressing excessive dishing and the viewpoint of suppressing excessive polishing of the stopper at the time of over-polishing. The lower limit of the zeta potential of the abrasive grains is preferably 10 mV or more, more preferably 20 mV or more, further preferably 25 mV or more, particularly preferably 30 mV or more, extremely preferably 40 mV or more, and highly preferably 50 mV or more, from the viewpoint of easily suppressing excessive dishing and the viewpoint of easily suppressing excessive polishing of the stopper at the time of over-polishing. The upper limit of the zeta potential of the abrasive grains is not particularly limited, but is preferably 200 mV or less. From these viewpoints, the zeta potential of the abrasive grains is more preferably 10 to 200 mV.

The zeta potential of the abrasive grains can be measured, for example, by using a dynamic light scattering type zeta potential measurement apparatus (for example, trade name: DelsaNano C manufactured by Beckman Coulter, Inc.). The zeta potential of the abrasive grains can be adjusted using an additive. For example, by bringing a monocarboxylic acid (acetic acid or the like) into contact with abrasive grains containing cerium oxide, abrasive grains having a positive zeta potential can be obtained. Also, by bringing ammonium dihydrogen phosphate, a material having carboxyl group (for example, polyacrylic acid) or the like into contact with abrasive grains containing cerium oxide, abrasive grains having a negative zeta potential can be obtained.

The lower limit of the content of the abrasive grains is preferably 0.005% by mass or more, more preferably 0.01% by mass or more, further preferably 0.02% by mass or more, particularly preferably 0.03% by mass or more, extremely preferably 0.04% by mass or more, highly preferably 0.05% by mass or more, even more preferably 0.07% by mass or more, more preferably 0.1% by mass or more, further preferably 0.12% by mass or more, particularly preferably 0.13% by mass or more, extremely preferably 0.14% by mass or more, highly preferably 0.15% by mass or more, and even more preferably 0.16% by mass or more, on the basis of the total mass of the polishing liquid, from the viewpoint of easily improving the polishing rate for an insulating material. The upper limit of the content of the abrasive grains is preferably 20% by mass or less, more preferably 15% by mass or less, further preferably 10% by mass or less, particularly preferably 5% by mass or less, extremely preferably 4% by mass or less, highly preferably 3% by mass or less, even more preferably 1% by mass or less, more preferably 0.5% by mass or less, further preferably 0.3% by mass or less, and particularly preferably 0.2% by mass or less, on the basis of the total mass of the polishing liquid, from the viewpoint of easily obtaining excellent dispersion stability of the abrasive grains. From these viewpoints, the content of the abrasive grains is more preferably 0.005 to 20% by mass and further preferably 0.01 to 10% by mass, on the basis of the total mass of the polishing liquid.

The abrasive grains may include composite particles composed of a plurality of particles in contact with each other. For example, the abrasive grains may include composite particles including first particles and second particles in contact with the first particles or may include composite particles and free particles (for example, second particles not in contact with first particles).

The abrasive grains are preferably an embodiment including first particles and second particles in contact with the first particles, in which the particle diameter of the second particles is smaller than the particle diameter of the first particles, the first particles contains cerium oxide, and the second particles contains a cerium compound, as an embodiment including composite particles. By using such abrasive grains, the polishing rate for an insulating material (for example, silicon oxide) is easily improved. The reasons why the polishing rate for an insulating material is improved in this way are, for example, the reasons to be as follows. However, the reasons are not limited to the reasons to be as follows.

That is, the first particles containing cerium oxide and having a larger particle diameter than that of the second particles have strong mechanical action (mechanical property) with respect to an insulating material as compared to the second particles. On the other hand, the second particles containing a cerium compound and having a smaller particle diameter than that of the first particles have small mechanical action with respect to an insulating material as compared to the first particles, but have strong chemical action (chemical property) with respect to an insulating material since the specific surface area (surface area per unit mass) in the whole particle is large. Therefore, a synergetic effect of improving the polishing rate is easily obtained by using the first particles having strong mechanical action and the second particles having strong chemical action.

Examples of the cerium compound of the second particles include cerium hydroxide and cerium oxide. As the cerium compound of the second particles, a compound different from cerium oxide can be used. The cerium compound preferably contains cerium hydroxide from the viewpoint of easily improving the polishing rate for an insulating material.

The particle diameter of the second particles is preferably smaller than the particle diameter of the first particles. The magnitude relationship in particle diameter between the first particles and the second particles can be determined from SEM images of the composite particle, or the like. In general, particles having a small particle diameter have a larger surface area per unit mass than that of particles having a large particle diameter, and thus have higher reaction activity. On the other hand, the mechanical action (mechanical polishing force) of particles having a small particle diameter is smaller than that of particles having a large particle diameter. However, in the present embodiment, even in a case where the particle diameter of the second particles is smaller than the particle diameter of the first particles, the synergetic effect of the first particles and the second particles can be expressed and both of excellent reaction activity and mechanical action can be achieved.

The lower limit of the particle diameter of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint of easily improving the polishing rate for an insulating material. The upper limit of the particle diameter of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of easily improving the dispersibility of the abrasive grains and the viewpoint of easily suppressing scratches at a polished surface. From these viewpoints, the particle diameter of the first particles is more preferably 15 to 1000 nm. The average particle diameter (average secondary particle diameter) of the first particles may be in the above ranges.

The lower limit of the particle diameter of the second particles is preferably 1 nm or more, more preferably 2 nm or more, and further preferably 3 nm or more, from the viewpoint of easily improving the polishing rate for an insulating material. The upper limit of the particle diameter of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of easily improving the dispersibility of the abrasive grains and the viewpoint of easily suppressing scratches at a polished surface. From these viewpoints, the particle diameter of the second particles is more preferably 1 to 50 nm. The average particle diameter (average secondary particle diameter) of the second particles may be in the above ranges.

The first particles can have a negative zeta potential. The second particles can have a positive zeta potential.

As an embodiment including the above-described composite particles and free particles, when an aqueous dispersion (a mixture composed of abrasive grains and water) in which the content of the abrasive grains is adjusted to 1.0% by mass is subjected to centrifugal separation at a centrifugal acceleration of $5.8 \times 10^4$ G for 5 minutes, the abrasive grains preferably provides a liquid phase (supernatant solution) in which an absorbance for light having a wavelength of 380 nm is more than 0. In this case, the polishing rate for an insulating material (for example, silicon oxide) is easily improved.

The reasons why the polishing rate is improved in this way are, for example, the reasons to be as follows. However, the reasons are not limited to the reasons to be as follows.

That is, in a case where the absorbance for light having a wavelength of 380 nm is more than 0 in a liquid phase obtained when the aqueous dispersion is subjected to centrifugal separation, in such centrifugal separation, the composite particles are easily selectively removed and a liquid phase containing free particles as the solid content is obtainable, and in a case where the absorbance is more than 0, the abrasive grains contain free particles in addition to the composite particles. Since the free particles have a smaller particle diameter than that of the composite particles, the free particles have a high diffusion rate and are preferentially adsorbed to a surface of an insulating material to coat the surface. In this case, the composite particles act on the free particles adsorbed to the insulating material as well as acting directly on the insulating material, and thus can also act indirectly on the insulating material (for example, the physical action can be transferred to the insulating material through the free particles adsorbed to the insulating material). According to this, it is speculated that the polishing rate for an insulating material is easily improved.

The above-described absorbance for light having a wavelength of 380 nm is preferably in the following range. The lower limit of the absorbance is preferably 0.001 or more, more preferably 0.0015 or more, and further preferably 0.002 or more, from the viewpoint of easily further improving the polishing rate for an insulating material. In a case where the content of free particles is large, it is speculated that the amount of adsorption of free particles with respect to the insulating material is increased, and thus the polishing rate for an insulating material is easily further improved. The upper limit of the absorbance is preferably 0.5 or less, more preferably 0.4 or less, further preferably 0.3 or less, particularly preferably 0.25 or less, and extremely preferably 0.2 or less, from the viewpoint of easily further improving the polishing rate for an insulating material. From the above-described viewpoint, the absorbance is more preferably more than 0 and 0.5 or less. The above-described absorbance can be adjusted by adjusting the content of free particles in the abrasive grains. For example, the above-described absorbance can be decreased by increasing the surface area of the first particles with which the second particles are in contact, adjusting a state to an insufficient dispersion state when the first particles and the second particles are brought into contact with each other (by decreasing a dispersion time, decreasing the number of rotations in stirring of a liquid containing the first particles and the second particles, weakening electrostatic repulsion generated between particles, or the like), and the like.

In the present embodiment, the above-described abrasive grains in which an absorbance for light having a wavelength of 380 nm is 0 may be used. Such abrasive grains can be obtained by removing free particles by centrifugal separation.

From the viewpoint of easily further improving the polishing rate for an insulating material (for example, silicon oxide), when an aqueous dispersion (a mixture composed of abrasive grains and water) in which the content of the abrasive grains is adjusted to 1.0% by mass is subjected to centrifugal separation at a centrifugal acceleration of $5.8 \times 10^4$ G for 5 minutes, the abrasive grains preferably provide a liquid phase (supernatant solution) in which a light transmittance for light having a wavelength of 500 nm is in the following range. The lower limit of the light transmittance is preferably 50%/cm or more, more preferably 60%/cm or more, further preferably 70%/cm or more, particularly preferably 80%/cm or more, extremely preferably 90%/cm or more, and highly preferably 92%/cm or more. The upper limit of the light transmittance is 100%/cm.

The composite particles including the first particles and the second particles can be obtained, for example, by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

The lower limit of the content of the cerium oxide in the first particles is preferably 50% by mass or more, more preferably 70% by mass or more, further preferably 90% by mass or more, and particularly preferably 95% by mass or more, on the basis of the whole first particles (the whole first particles contained in the polishing liquid; the same applies hereinafter), from the viewpoint of easily improving the polishing rate for an insulating material. The first particles may be an embodiment substantially composed of cerium oxide (an embodiment in which 100% by mass of the first particles are substantially cerium oxide).

The lower limit of the content of the cerium compound in the second particles is preferably 50% by mass or more, more preferably 70% by mass or more, further preferably 90% by mass or more, and particularly preferably 95% by mass or more, on the basis of the whole second particles (the whole second particles contained in the polishing liquid; the same applies hereinafter), from the viewpoint of easily improving the polishing rate for an insulating material. The second particles may be an embodiment substantially composed of a cerium compound (an embodiment in which 100% by mass of the second particles are substantially a cerium compound).

The content of the second particles can be estimated on the basis of a value of absorbance of equation below which is obtained by a spectrophotometer when light having a specific wavelength is transmitted through the polishing liquid. That is, in a case where particles absorb light having a specific wavelength, the light transmittance of a region containing the particles is decreased. The light transmittance is decreased not only by absorption of the particles but also by scattering, but in the second particles, the influence of scattering is small Therefore, in present embodiment, the content of the second particles can be estimated on the basis of a value of absorbance calculated by equation below.

$$\text{Absorbance} = -\text{LOG}_{10}(\text{Light transmittance [\%]}/100)$$

The content of the first particles in the abrasive grains including composite particles is preferably in the following range on the basis of the whole abrasive grains. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the first particles is preferably 95% by mass or less, more preferably 93% by mass or less, and further preferably 91% by mass or less, from the viewpoint of easily improving the polishing rate for an insulating material. From these viewpoints, the content of the first particles is more preferably 50 to 95% by mass.

The content of the second particles in the abrasive grains including composite particles is preferably in the following range on the basis of the whole abrasive grains. The lower limit of the content of the second particles is preferably 5% by mass or more, more preferably 7% by mass or more, and further preferably 9% by mass or more, from the viewpoint of easily improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the second particles is more preferably 5 to 50% by mass.

The content of the cerium oxide in the abrasive grains including composite particles is preferably in the following range on the basis of the whole abrasive grains. The lower limit of the content of the cerium oxide is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the cerium oxide is preferably 95% by mass or less, more preferably 93% by mass or less, and further preferably 91% by mass or less, from the viewpoint of easily improving the polishing rate for an insulating material. From these viewpoints, the content of the cerium oxide is more preferably 50 to 95% by mass.

The content of the cerium hydroxide in the abrasive grains including composite particles is preferably in the following range on the basis of the whole abrasive grains. The lower limit of the content of the cerium hydroxide is preferably 5% by mass or more, more preferably 7% by mass or more, and further preferably 9% by mass or more, from the viewpoint of easily improving the polishing rate for an insulating material. The upper limit of the content of the cerium hydroxide is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the cerium hydroxide is more preferably 5 to 50% by mass.

The content of the first particles is preferably in the following range on the basis of the total amount of the first particles and the second particles. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the first particles is preferably 95% by mass or less, more preferably 93% by mass or less, and further preferably 91% by mass or less, from the viewpoint of easily improving the polishing rate for an insulating material. From these viewpoints, the content of the first particles is more preferably 50 to 95% by mass.

The content of the second particles is preferably in the following range on the basis of the total amount of the first particles and the second particles. The lower limit of the content of the second particles is preferably 5% by mass or more, more preferably 7% by mass or more, and further preferably 9% by mass or more, from the viewpoint of easily improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the second particles is more preferably 5 to 50% by mass.

The content of the first particles in the polishing liquid is preferably in the following range on the basis of the total mass of the polishing liquid. The lower limit of the content of the first particles is preferably 0.005% by mass or more, more preferably 0.008% by mass or more, further preferably 0.01% by mass or more, particularly preferably 0.05% by mass or more, extremely preferably 0.08% by mass or more, highly preferably 0.1% by mass or more, and even more preferably 0.15 by mass or more, from the viewpoint of easily improving the polishing rate for an insulating material. The upper limit of the content of the first particles is preferably 5% by mass or less, more preferably 3% by mass or less, further preferably 1% by mass or less, particularly preferably 0.5% by mass or less, extremely preferably 0.3% by mass or less, and highly preferably 0.2% by mass or less, from the viewpoint of easily enhancing the storage stability of the polishing liquid. From these viewpoints, the content of the first particles is more preferably 0.005 to 5% by mass.

The content of the second particles in the polishing liquid is preferably in the following range on the basis of the total mass of the polishing liquid. The lower limit of the content of the second particles is preferably 0.005% by mass or more, more preferably 0.008% by mass or more, further preferably 0.01% by mass or more, particularly preferably 0.012% by mass or more, and extremely preferably 0.015% by mass or more, from the viewpoints of easily improving the chemical interaction between the abrasive grains and a surface to be polished and easily improving the polishing rate for an insulating material. The upper limit of the content of the second particles is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, and particularly preferably 0.02% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From these viewpoints, the content of the second particles is more preferably 0.005 to 5% by mass.

The content of the cerium oxide in the polishing liquid containing abrasive grains including composite particles is preferably in the following range on the basis of the total mass of the polishing liquid. The lower limit of the content of the cerium oxide is preferably 0.005% by mass or more, more preferably 0.008% by mass or more, further preferably 0.01% by mass or more, particularly preferably 0.05% by mass or more, extremely preferably 0.08% by mass or more, highly preferably 0.1% by mass or more, and even more preferably 0.15 by mass or more, from the viewpoint of easily improving the polishing rate for an insulating material. The upper limit of the content of the cerium oxide is preferably 5% by mass or less, more preferably 3% by mass or less, further preferably 1% by mass or less, particularly preferably 0.5% by mass or less, extremely preferably 0.3% by mass or less, and highly preferably 0.2% by mass or less, from the viewpoint of easily enhancing the storage stability of the polishing liquid. From these viewpoints, the content of the cerium oxide is more preferably 0.005 to 5% by mass.

The content of the cerium hydroxide in the polishing liquid containing abrasive grains including composite particles is preferably in the following range on the basis of the total mass of the polishing liquid. The lower limit of the content of the cerium hydroxide is preferably 0.005% by mass or more, more preferably 0.008% by mass or more, further preferably 0.01% by mass or more, particularly preferably 0.012% by mass or more, and extremely preferably 0.015% by mass or more, from the viewpoints of further improving the chemical interaction between the abrasive grains and a surface to be polished and easily improving the polishing rate for an insulating material. The upper limit of the content of the cerium hydroxide is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, and particularly preferably 0.02% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From these viewpoints, the content of the cerium hydroxide is more preferably 0.005 to 5% by mass.

(Additive)

The polishing liquid of the present embodiment contains an additive. Here, "additive" refers to a substance that is contained in the polishing liquid in addition to the abrasive grains and a liquid medium.

[Hydroxy Acid]

The polishing liquid of the present embodiment contain a hydroxy acid (excluding a compound corresponding to an aminocarboxylic acid or an aminosulfonic acid). The hydroxy acid has at least one carboxyl group and at least one hydroxyl group. "—OH" in carboxyl group is not included in the "hydroxyl group". The "hydroxyl group" may be either an alcoholic hydroxyl group or a phenolic hydroxyl group. The hydroxy acid may not have a phenolic hydroxyl group.

The hydroxy acid preferably has one carboxyl groups and one to three hydroxyl groups (for example, alcoholic hydroxyl groups), from the viewpoint of easily suppressing excessive dishing and the viewpoint of easily suppressing excessive polishing of the stopper at the time of over-polishing. The number of hydroxyl groups of the hydroxy acid is preferably 1 or 2 and more preferably 2, from the viewpoint of easily suppressing excessive dishing and the viewpoint of easily suppressing excessive polishing of the stopper at the time of over-polishing. The hydroxy acid preferably contains a compound having a quaternary carbon atom, from the viewpoint of easily suppressing excessive dishing. The hydroxy acid preferably contains a compound having a plurality of (for example, two) hydroxyalkyl groups (for example, hydroxymethyl groups) and more preferably contains a compound having a carbon atom to which a plurality of (for example, two) hydroxyalkyl groups (for example, hydroxymethyl groups) are bonded, from the viewpoint of easily suppressing excessive dishing.

Examples of the hydroxy acid include glycolic acid, glyceric acid, lactic acid (for example, DL-lactic acid), 2,2-bis(hydroxymethyl)propionic acid, 2,2-bis(hydroxymethyl)butyric acid, N,N-bis(2-hydroxyethyl)glycine, N-[2-hydroxy-1,1-bis(hydroxymethyl)ethyl]glycine, bicin, tricine, glucuronic acid, gluconic acid, citric acid, and tartaric acid. From the viewpoint of easily suppressing excessive dishing and the viewpoint of easily suppressing excessive polishing of the stopper at the time of over-polishing, the hydroxy acid preferably contains at least one selected from the group consisting of 2,2-bis(hydroxymethyl)propionic acid and 2,2-bis(hydroxymethyl)butyric acid, and more preferably contains 2,2-bis(hydroxymethyl)butyric acid. The hydroxy acid can be used singly or in combination of two or more kinds thereof.

The lower limit of the content of the hydroxy acid is preferably 0.01% by mass or more, more preferably 0.03% by mass or more, further preferably 0.05% by mass or more, particularly preferably 0.08% by mass or more, and extremely preferably 0.1% by mass or more, on the basis of the total mass of the polishing liquid, from the viewpoint of easily suppressing excessive dishing and the viewpoint of easily suppressing excessive polishing of the stopper at the time of over-polishing. The upper limit of the content of the hydroxy acid is preferably 1.0% by mass or less, more preferably 0.8% by mass or less, further preferably 0.5% by mass or less, particularly preferably 0.4% by mass or less, extremely preferably 0.3% by mass or less, and highly preferably 0.2% by mass or less, on the basis of the total mass of the polishing liquid, from the viewpoint of easily obtaining a suitable polishing rate for an insulating material. From these viewpoints, the content of the hydroxy acid is more preferably 0.01 to 1.0% by mass on the basis of the total mass of the polishing liquid.

[Polyol]

The polishing liquid of the present embodiment contain a polyol (excluding a compound corresponding to a hydroxy acid, an aminocarboxylic acid, or an aminosulfonic acid). The polyol is a compound having two or more hydroxyl groups in the molecule.

Examples of the polyol include polyglycerin, polyvinyl alcohol, polyalkylene glycol (polyethylene glycol or the like), polyoxyalkylene glycol, polyoxyalkylene sorbitol ether (polyoxypropylene sorbitol ether or the like), a polyoxyalkylene condensate of ethylenediamine (ethylene diamine tetrapolyoxyethylene polyoxypropylene or the like), 2,2-bis(4-polyoxyalkylene-oxyphenyl)propane, polyoxyalkylene glyceryl ether, polyoxyalkylene diglyceryl ether, polyoxyalkylene trimethylolpropane ether (polyoxyethylene trimethylol propane ether or the like), pentaerythritol polyoxyalkylene ether (pentaerythritol polyoxypropylene ether or the like), and polyoxyalkylene methyl glucoside. The polyol may contain a polyol not having an aromatic group. The polyol can be used singly or in combination of two or more kinds thereof.

From the viewpoint of easily suppressing excessive dishing and the viewpoint of easily suppressing excessive polishing of the stopper at the time of over-polishing, the polyol preferably contains a polyether polyol (a polyol having a polyether structure). The polyether polyol preferably has a polyoxyalkylene group. According to this, it is easy to form a protective layer on a surface to be polished to moderately adjust the polishing rate, and thus, excessive polishing of the concave portion is easily suppressed, and therefore, it is easy to flatly finish a wafer after polishing.

The number of carbon atoms of oxyalkylene of the polyoxyalkylene group of the polyol is preferably 1 or more, and more preferably 2 or more, from the viewpoint of easily obtaining excellent dispersion stability of the abrasive grains. The number of carbon atoms of oxyalkylene of the polyoxyalkylene group is preferably 5 or less, more preferably 4 or less, and further preferably 3 or less, from the viewpoint of easily obtaining excellent dispersion stability of the abrasive grains. From these viewpoints, the number of carbon atoms is more preferably 1 to 5. The polyoxyalkylene group may be a homopolymer chain and it may be a copolymer chain. The copolymer chain may be a block polymer chain and it may be a random polymer chain.

The polyol preferably contains at least one selected from the group consisting of polyoxyalkylene trimethylolpropane ether, pentaerythritol polyoxyalkylene ether, and polyalkylene glycol, more preferably contains at least one selected from the group consisting of polyoxyethylene trimethylol propane ether, pentaerythritol polyoxyethylene ether, and polyethylene glycol, and further preferably contains at least one selected from the group consisting of polyoxyethylene trimethylol propane ether and polyethylene glycol, from the viewpoint of easily suppressing excessive dishing and the viewpoint of easily suppressing excessive polishing of the stopper at the time of over-polishing.

The polyol preferably satisfies at least one of properties described below, from the viewpoint of easily suppressing excessive dishing. The polyol preferably contains a compound different from α-glucose polymers. The polyol preferably contains a compound not having a structure unit derived from α-glucose. The polyol preferably contains a compound not having a cyclic structure (a six-membered ring, a five-membered ring, or the like). The polyol preferably contains a compound not having a glycoside bond. The polyol preferably contains a compound having a hydroxyl group bonded to a primary carbon atom, and more preferably contains a compound having only a hydroxyl group bonded to a primary carbon atom as a hydroxyl group. The polyol preferably contains a compound not having a hydroxyl group bonded to a secondary carbon atom. The polyol preferably contains a compound not having a plurality of structure units having a hydroxyl group.

The polyol preferably contains a compound in which the number of hydroxyl groups is in the following range. The lower limit of the number of hydroxyl groups is preferably 2 or more and more preferably 3 or more, from the viewpoint of easily suppressing excessive dishing. The upper limit of the number of hydroxyl groups is preferably 6 or less, more preferably 5 or less, and further preferably 4 or less, from the viewpoint of easily suppressing excessive dishing. From these viewpoints, the number of hydroxyl groups is more preferably 2 to 6.

The lower limit of the molecular weight of the polyol is preferably 100 or more, more preferably 200 or more, further preferably 300 or more, and particularly preferably 330 or more, from the viewpoint of easily suppressing excessive dishing. The upper limit of the molecular weight of the polyol is preferably 500000 or less, more preferably 100000 or less, further preferably 80000 or less, particularly preferably 50000 or less, extremely preferably 30000 or less, highly preferably 25000 or less, even more preferably 20000 or less, more preferably 10000 or less, further preferably 5000 or less, particularly preferably 4000 or less, extremely preferably 3000 or less, highly preferably 1000 or less, even more preferably 800 or less, more preferably 500 or less, and further preferably 400 or less, from the viewpoint of easily obtaining a suitable polishing rate for an insulating material. From these viewpoints, the molecular weight of the polyol is more preferably 100 to 500000, further preferably 100 to 20000, and particularly preferably 100 to 5000.

In a case where the polyol has a polyoxyalkylene group, the molecular weight of the polyol may be a weight average molecular weight. The weight average molecular weight of the compound having a hydroxyl group and a polyoxyalkylene group may be more than 1000, 2000 or more, 3000 or more, or 4000 or more. The weight average molecular weight can be measured, for example, by gel permeation chromatography (GPC) under the following conditions, using a calibration curve of standard polystyrene.

Instrument used: Hitachi L-6000 Model [manufactured by Hitachi, Ltd.]
Column: Gel-Pak GL-R420+Gel-Pak GL-R430+Gel-Pak GL-R440 [manufactured by Hitachi Chemical Company, Ltd., trade names, three columns in total]
Eluent: tetrahydrofuran
Measurement temperature: 40° C.
Flow rate: 1.75 mL/min
Detector: L-3300RI [manufactured by Hitachi, Ltd.]

The lower limit of the hydroxyl value of the polyol is preferably 1 mgKOH/g or more, more preferably 3 mgKOH/g or more, further preferably 5 mgKOH/g or more, particularly preferably 10 mgKOH/g or more, and extremely preferably 15 mgKOH/g or more, from the viewpoint of easily suppressing excessive dishing. The upper limit of the hydroxyl value of the polyol is preferably 1000 mgKOH/g or less, more preferably 800 mgKOH/g or less, further preferably 750 mgKOH/g or less, and particularly preferably 700 mgKOH/g or less, from the viewpoint of easily suppressing excessive dishing. From these viewpoints, the hydroxyl value of the polyol is more preferably 1 to 700 mgKOH/g.

The lower limit of the content of the polyol is preferably 0.05% by mass or more, more preferably 0.1% by mass or more, further preferably 0.2% by mass or more, particularly preferably 0.3% by mass or more, and extremely preferably 0.4% by mass or more, on the basis of the total mass of the polishing liquid, from the viewpoint of easily suppressing excessive dishing and the viewpoint of easily suppressing excessive polishing of the stopper at the time of over-polishing. The upper limit of the content of the polyol is preferably 5.0% by mass or less, more preferably 3.0% by mass or less, further preferably 2.0% by mass or less, and particularly preferably 1.0% by mass or less, on the basis of the total mass of the polishing liquid, from the viewpoint of easily obtaining a suitable polishing rate for an insulating material. The content thereof is highly preferably 0.5% by mass or less. From these viewpoints, the content of the polyol is more preferably 0.05 to 5.0% by mass on the basis of the total mass of the polishing liquid.

[Zwitterionic Compound]

The polishing liquid of the present embodiment contains at least one zwitterionic compound selected from the group consisting of an aminocarboxylic acid and an aminosulfonic acid. A compound corresponding to the aminosulfonic acid does not belong to the aminocarboxylic acid. Each of the aminocarboxylic acid and the aminosulfonic acid can be used singly or in combination of two or more kinds thereof.

The molecular weight of the zwitterionic compound is preferably 300 or less, more preferably 250 or less, further preferably 200 or less, particularly preferably 180 or less, and extremely preferably 175 or less, from the viewpoint of easily suppressing that the insulating material is excessively strongly covered by the zwitterionic compound. The molecular weight of the zwitterionic compound may be 170 or less, 150 or less, 130 or less, 120 or less, or 100 or less. The molecular weight of the zwitterionic compound may be 50 or more, 60 or more, or 70 or more. The molecular weight of the zwitterionic compound may be 50 to 300.

The isoelectric point (pI) of the aminocarboxylic acid is smaller than 7.0, from the viewpoint of suppressing excessive dishing and the viewpoint of suppressing excessive polishing of the stopper at the time of over-polishing. The upper limit of the isoelectric point of the aminocarboxylic acid is preferably 6.8 or less, more preferably 6.5 or less, further preferably 6.3 or less, and particularly preferably 6.0 or less, from the viewpoint of easily suppressing excessive dishing and the viewpoint of easily suppressing excessive polishing of the stopper at the time of over-polishing. The upper limit of the isoelectric point of the aminocarboxylic acid may be 5.9 or less, 5.8 or less, 5.7 or less, 5.65 or less, 5.6 or less, 5.5 or less, 5.0 or less, 4.5 or less, 4.0 or less, or 3.5 or less. The lower limit of the isoelectric point of the aminocarboxylic acid may be 2.0 or more, 2.5 or more, or 3.0 or more. The isoelectric point of the aminocarboxylic acid may be 2.0 or more and less than 7.0. The isoelectric point of the aminocarboxylic acid can be measured according to JIS K 0113 by a potential difference measurement apparatus (for example, "HIRANUMA Automatic Titrator COM-1750 series" manufactured by HIRANUMA SANGYO Co., Ltd.).

The lower limit of the acid dissociation constant (pKa, negative common logarithm (logarithm of reciprocal) of equilibrium constant Ka) of the aminocarboxylic acid may be a value larger than 0, and may be 1.0 or more, 1.5 or more, 2.0 or more, 2.1 or more, or 2.3 or more. The upper limit of the acid dissociation constant of the aminocarboxylic acid may be 8.0 or less, 7.0 or less, 5.0 or less, 4.0 or less, or 3.0 or less. In a case where there are a plurality of acid dissociation constants, the acid dissociation constant means pKa1 at the first stage (the same applies hereinafter).

The aminocarboxylic acid has an amino group as a cationic portion and a carboxyl group as an anionic portion. The aminocarboxylic acid may be at least one selected from the group consisting of a neutral aminocarboxylic acid and an acidic aminocarboxylic acid. Examples of the neutral aminocarboxylic acid include aliphatic amino acids such as glycine, alanine, valine, leucine, and isoleucine; oxyamino acids such as serine and threonine; sulfur-containing amino acids such as cysteine, cystine, and methionine; aromatic amino acids such as phenylalanine, tyrosine, and tryptophan; and amino-acid amide acetates such as asparagine and glutamine. Examples of the acidic amino acid include asparaginic acid and glutamic acid. The aminocarboxylic acid preferably contains at least one selected from the group consisting of glycine, serine, cysteine, glutamine, and glutamic acid, from the viewpoint of easily suppressing excessive dishing and the viewpoint of easily suppressing excessive polishing of the stopper at the time of over-polishing.

In a case where the polishing liquid contain an aminocarboxylic acid, the lower limit of the content of the aminocarboxylic acid is preferably 0.01% by mass or more, more preferably 0.02% by mass or more, further preferably more than 0.02% by mass, particularly preferably 0.03% by mass or more, extremely preferably 0.05% by mass or more, highly preferably 0.08% by mass or more, and even more preferably 0.1% by mass or more, on the basis of the total mass of the polishing liquid, from the viewpoint of easily suppressing excessive dishing and the viewpoint of easily suppressing excessive polishing of the stopper at the time of over-polishing. The upper limit of the aminocarboxylic acid is preferably 1.0% by mass or less, more preferably 0.8% by mass or less, further preferably 0.5% by mass or less, particularly preferably 0.4% by mass or less, extremely preferably 0.3% by mass or less, and highly preferably 0.2% by mass or less, on the basis of the total mass of the polishing liquid, from the viewpoint of easily obtaining a suitable polishing rate for an insulating material. From these viewpoints, the content of the aminocarboxylic acid is more preferably 0.01 to 1.0% by mass on the basis of the total mass of the polishing liquid.

The aminosulfonic acid has an amino group as a cationic portion and a sulfonic acid group as an anionic portion. Examples of the aminosulfonic acid include sulfamic acid, aliphatic aminosulfonic acid, and aromatic aminosulfonic acid.

Examples of the aliphatic aminosulfonic acid include aminomethanesulfonic acid, aminoethanesulfonic acid (for example, 1-aminoethanesulfonic acid and 2-aminoethanesulfonic acid (also known as taurine)), and aminopropanesulfonic acid (for example, 1-aminopropan-2-sulfonic acid and 2-aminopropan-1-sulfonic acid). The aliphatic aminosulfonic acid preferably contains aminoethanesulfonic acid, from the viewpoint of easily suppressing excessive dishing and the viewpoint of easily suppressing excessive polishing of the stopper at the time of over-polishing.

The aromatic aminosulfonic acid is defined as an aromatic compound (preferably, aromatic hydrocarbon) having an amino group and a sulfonic acid group. Examples of the aromatic aminosulfonic acid include aminobenzenesulfonic acid (for example, orthanilic acid (also known as 2-aminobenzenesulfonic acid), metanilic acid (also known as 3-aminobenzenesulfonic acid), and sulfanilic acid (also known as 4-aminobenzenesulfonic acid)), diaminobenzenesulfonic acid (for example, 2,4-diaminobenzenesulfonic acid and 3,4-diaminobenzenesulfonic acid), and aminonaphthalenesulfonic acid. The aromatic aminosulfonic acid preferably contains sulfanilic acid, from the viewpoint of easily suppressing excessive dishing and the viewpoint of easily suppressing excessive polishing of the stopper at the time of over-polishing.

The pKa of the aminosulfonic acid is larger than 0, from the viewpoint of suppressing excessive dishing and the viewpoint of suppressing excessive polishing of the stopper at the time of over-polishing. The lower limit of the pKa of the aminosulfonic acid is preferably 0.2 or more, more preferably 0.5 or more, further preferably 0.7 or more, and particularly preferably 0.9 or more, from the viewpoint of easily obtaining a suitable polishing rate for an insulating material and the viewpoint of suppressing excessive polishing for the stopper at the time of over-polishing. The lower limit of the pKa of the aminosulfonic acid is preferably 5.0 or less, more preferably 4.0 or less, further preferably 3.5 or less, and particularly preferably 3.2 or less, from the viewpoint of easily suppressing excessive dishing and the viewpoint of easily suppressing excessive polishing of the stopper at the time of over-polishing. From these viewpoints, the pKa of the aminosulfonic acid is more preferably larger than 0 and 5.0 or less. The lower limit of the pKa of the aminosulfonic acid may be 3.0 or less, 2.5 or less, 2.0 or less, 1.5 or less, 1.2 or less, or 1.0 or less.

The aminosulfonic acid preferably contains at least one selected from the group consisting of sulfamic acid, aliphatic aminosulfonic acid, and aromatic aminosulfonic acid, more preferably contains at least one selected from the group consisting of sulfamic acid and aromatic aminosulfonic acid, and further preferably contains sulfamic acid, from the viewpoint of easily suppressing excessive dishing and the viewpoint of easily suppressing excessive polishing of the stopper at the time of over-polishing.

In a case where the polishing liquid contains an aminosulfonic acid, the lower limit of the content of the aminosulfonic acid is preferably 0.01% by mass or more, more preferably 0.03% by mass or more, further preferably 0.05% by mass or more, particularly preferably 0.08% by mass or more, and extremely preferably 0.1% by mass or more, on the basis of the total mass of the polishing liquid, from the viewpoint of easily suppressing excessive dishing and the viewpoint of easily suppressing excessive polishing of the stopper at the time of over-polishing. The upper limit of the content of the aminosulfonic acid is preferably 1.0% by mass or less, more preferably 0.8% by mass or less, further preferably 0.5% by mass or less, particularly preferably 0.4% by mass or less, extremely preferably 0.3% by mass or less, and highly preferably 0.2% by mass or less, on the basis of the total mass of the polishing liquid, from the viewpoint of easily obtaining a suitable polishing rate for an insulating material. From these viewpoints, the content of the aminosulfonic acid is more preferably 0.01 to 1.0% by mass on the basis of the total mass of the polishing liquid.

The content of the zwitterionic compound (the total amount of the aminocarboxylic acid and the aminosulfonic acid) is preferably in the following range on the basis of the total mass of the polishing liquid. The lower limit of the content of the zwitterionic compound is preferably 0.01% by mass or more, more preferably 0.03% by mass or more, further preferably 0.05% by mass or more, particularly preferably 0.08% by mass or more, and extremely preferably 0.1% by mass or more, from the viewpoint of easily suppressing excessive dishing and the viewpoint of easily suppressing excessive polishing of the stopper at the time of over-polishing. The upper limit of the content of the zwitterionic compound is preferably 1.0% by mass or less, more preferably 0.8% by mass or less, further preferably 0.5% by mass or less, particularly preferably 0.4% by mass or less, extremely preferably 0.3% by mass or less, and highly preferably 0.2% by mass or less, from the viewpoint of easily obtaining a suitable polishing rate for an insulating material. From these viewpoints, the content of the zwitterionic compound is more preferably 0.01 to 1.0% by mass.

[Arbitrary Additive]

The polishing liquid of the present embodiment may contain an arbitrary additive (excluding a compound corresponding to a hydroxy acid, a polyol, an aminocarboxylic acid, or an aminosulfonic acid). Examples of the arbitrary additive include water-soluble polymers, oxidants (for example, hydrogen peroxide), and dispersants (for example, a phosphoric acid-based inorganic salt). The "water-soluble polymer" is defined as a polymer which is dissolved in 100 g of water in an amount of 0.1 g or more. Examples of the water-soluble polymer include polyacrylic acid-based polymers such as polyacrylic acid, a polyacrylic acid copolymer, a polyacrylate, and polyacrylic acid copolymer salt; and polymethacrylic acid-based polymers such as polymethacrylic acid and polymethacrylate.

(Liquid Medium)

The liquid medium in the polishing liquid of the present embodiment is not particularly limited, but is preferably water such as deionized water or ultrapure water. The content of the liquid medium may correspond to the remaining of the polishing liquid from which the contents of other constituent components are removed, and is not particularly limited.

(Properties of Polishing Liquid)

The lower limit of the pH of the polishing liquid of the present embodiment is preferably 2.0 or more, more preferably 2.2 or more, further preferably 2.5 or more, particularly preferably 3.0 or more, extremely preferably 3.1 or more, and highly preferably 3.3 or more, from the viewpoint of easily obtaining excellent dispersion stability of the abrasive grains. The upper limit of the pH is preferably 6.0 or less, more preferably less than 6.0, further preferably 5.5 or less, particularly preferably 5.0 or less, extremely preferably less than 5.0, highly preferably 4.5 or less, even more preferably 4.2 or less, more preferably 4.0 or less, and further preferably 3.6 or less, from the viewpoint of easily obtaining excellent dispersion stability of the abrasive grains. From these viewpoints, the pH of the polishing liquid is more preferably 2.0 to 6.0 and further preferably 2.0 to 4.5. The pH of the polishing liquid is defined as the pH at a liquid temperature of 25° C.

The pH of the polishing liquid can be adjusted by an acid component such as an inorganic acid or an organic acid; an alkali component such as ammonia, sodium hydroxide, tetramethylammonium hydroxide (TMAH), imidazole, or alkanolamine; or the like. In order to stabilize the pH, a buffer may be added. A buffer solution (buffer-containing liquid) may be added as the buffer. Examples of such a buffer solution include an acetate buffer solution and a phthalate buffer solution.

The pH of the polishing liquid of the present embodiment can be measured by a pH meter (for example, Model No. PHL-40 manufactured by DKK-TOA CORPORATION). Specifically, for example, after performing 2-point calibration of the pH meter using a phthalate pH buffer solution (pH: 4.01) and a neutral phosphate pH buffer solution (pH: 6.86) as a standard buffer solution, an electrode of the pH meter is placed in the polishing liquid for 2 minutes or longer, and the value after stabilization is measured. The liquid temperature of both the standard buffer solution and the polishing liquid are set to 25° C.

The polishing liquid of the present embodiment may be stored as a one-pack type polishing liquid containing at least abrasive grains, a hydroxy acid, a polyol, the above-described zwitterionic compound, and a liquid medium, or may be stored as a multi-pack type (for example, two-pack type) polishing liquid set containing constituent components of the above-described polishing liquid divided into a slurry (first liquid) and an additive liquid (second liquid). The slurry contains, for example, at least abrasive grains and a liquid medium. The additive liquid contains, for example, at least a hydroxy acid, a polyol, a zwitterionic compound, and a liquid medium. Between the slurry and the additive liquid, a hydroxy acid, a polyol, a zwitterionic compound, an arbitrary additive, and a buffer are preferably contained in the additive liquid. Incidentally, the constituent components of the polishing liquid may be stored as a polishing liquid set divided into three or more liquids.

In the polishing liquid set, the slurry and the additive liquid are mixed immediately before polishing or during polishing to prepare the polishing liquid. Further, a one-pack type polishing liquid may be stored as a stock solution for a polishing liquid with a reduced liquid medium content and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

<Polishing Method>

The polishing method (polishing method of a base substrate, or the like) of the present embodiment may include a polishing step of polishing a surface to be polished (surface to be polished of the base substrate or the like) by using the above-described one-pack polishing liquid or a polishing liquid obtained by mixing the slurry and the additive liquid of the above-described polishing liquid set. The surface to be polished may contain silicon oxide and may further contain silicon nitride.

The polishing method of the present embodiment may be a polishing method for a base substrate having an insulating material and silicon nitride, and may include, for example, a polishing step of selectively polishing the insulating material with respect to silicon nitride by using the one-pack type polishing liquid or a polishing liquid obtained by mixing the slurry and the additive liquid of the polishing liquid set. In this case, the base substrate may have, for example, a member containing an insulating material and a member containing silicon nitride.

The polishing method of the present embodiment may be a polishing method for a base substrate having a first member containing silicon nitride and a second member containing an insulating material and also disposed on the first member. The polishing step may include a step of polishing the second member by using the one-pack type polishing liquid or a polishing liquid obtained by mixing the slurry and the additive liquid of the polishing liquid set, until the first member is exposed. The polishing step may include a step of polishing the first member and the second member by using the one-pack type polishing liquid or a polishing liquid obtained by mixing the slurry and the additive liquid of the polishing liquid set, after the first member is exposed.

The expression "selectively polishing a material A with respect to a material B" means that the polishing rate for the material A is higher than the polishing rate for the material B under the same conditions. More specifically, the above expression means, for example, that the material A is polished with a polishing rate ratio of the polishing rate for the material A to the polishing rate for the material B being 80 or more.

In the polishing step, for example, in a state where a material to be polished of the base substrate that has the material to be polished is pressed against a polishing pad (polishing cloth) of a polishing platen, the polishing liquid is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of a material to be polished include an insulating material (excluding a material corresponding to a stopper material) such as silicon oxide; and a stopper material such as silicon nitride. A material to be polished may be a single material or a plurality of materials. In a case where a plurality of materials are exposed on a surface to be polished, they can be considered as a material to be polished. A material to be polished may be in the form of a film (film to be polished) or may be a silicon oxide film, a silicon nitride film, or the like.

By polishing a material to be polished (for example, an insulating material such as silicon oxide) formed on such a substrate with the polishing liquid and removing an excess part, it is possible to eliminate irregularities on the surface of a material to be polished and to produce a smooth surface over the entire surface of the polished material. The polishing liquid of the present embodiment is preferably used for polishing a surface to be polished containing silicon oxide.

In the present embodiment, it is possible to polish an insulating material of a base substrate having an insulating material containing silicon oxide on at least the surface, a stopper (polishing stop layer) disposed as an underlayer of the insulating material, and a substrate (semiconductor substrate or the like) disposed under the stopper. The stopper material constituting the stopper is preferably silicon nitride that is a material having a polishing rate lower than that of the insulating material.

Examples of a method for forming a material to be polished by the polishing liquid of the present embodiment include a CVD method such as a low-pressure CVD method, a normal-pressure CVD method, or a plasma CVD method; and a rotation application method in which a liquid raw material is applied to a rotating substrate.

Hereinafter, the polishing method of the present embodiment will be described by taking a polishing method for a base substrate (for example, a base substrate having an insulating material formed on a semiconductor substrate) as an example. In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, a polishing apparatus: MIRRA manufactured by Applied Materials, Inc. can be used.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, at least one selected from the group consisting of foamed polyurethane and unfoamed polyurethane is preferable from the viewpoint of being further excellent in polishing rate and flatness. It is preferable that the polishing pad is subjected to grooving so that the polishing liquid is pooled.

Polishing conditions are not particularly limited, but the upper limit of the rotation speed of a polishing platen is preferably 200 min$^{-1}$ or less such that the base substrate is not let out, and the upper limit of the polishing pressure to be applied to the base substrate (processing load) is preferably 15 psi (103 kPa) or less from the viewpoint of sufficiently suppressing the generation of polishing scratches. The polishing liquid is preferably continuously supplied to the polishing pad with a pump or the like during polishing. The amount supplied for this is not particularly limited, but it is preferable that the surface of the polishing pad is always covered with the polishing liquid.

The base substrate after the completion of polishing is preferably thoroughly washed in flowing water to remove the particles adhering to the base substrate. For the washing, dilute hydrofluoric acid or ammonia water may be concurrently used in addition to pure water, and a brush may be concurrently used to increase the washing efficiency. Further, it is preferable that, after washing, the water droplets adhering to the base substrate are removed off using a spin dryer or the like, and then the base substrate is dried.

The present embodiment can be suitably used in formation of an STI. For the formation of the STI, the lower limit of the polishing rate ratio of the insulating material (for example, silicon oxide) to the stopper material (for example, silicon nitride) is preferably 80 or more. When the polishing rate ratio is less than 80, the magnitude of the polishing rate for an insulating material with respect to the polishing rate for the stopper material is small, and thus, it will tend to be difficult to stop polishing at a predetermined position during formation of the STI. On the other hand, when the polishing rate ratio is 80 or more, it will be easier to stop polishing, which is further suitable for STI formation. The lower limit of the polishing rate for an insulating material (for example, silicon oxide) is preferably 50 nm/min or more, more preferably 70 nm/min or more, further preferably 80 nm/min or more, particularly preferably 100 nm/min or more, and extremely preferably 120 nm/min or more.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic conductive materials such as ITO; and polymer resin materials such as polyimide-based, polybenzooxazole-based, acrylic, epoxy-based, and phenol-based materials.

The present embodiment can be used not only to film-like materials to be polished, but also to various types of substrates made of glass, silicon, SiC, SiGe, Ge, GaN, GaP, GaAs, sapphire, plastics, and the like.

The present embodiment can be used not only for production of semiconductor elements, but also for production of image display devices such as TFTs and organic ELs; optical parts such as photomasks, lenses, prisms, optical fibers, and single crystal scintillators; optical elements such as optical switching elements and optical waveguides; light-emitting elements such as solid lasers and blue laser LEDs; magnetic storage devices such as magnetic disks and magnetic heads; and the like.

EXAMPLES

Hereinafter, the present invention will be described in detail by means of Examples. However, the present invention is not limited to the following Examples.

<Preparation of Cerium Oxide Slurry>

Cerium oxide particles (first particles) and trade name: ammonium dihydrogen phosphate manufactured by Wako Pure Chemical Industries, Ltd. (molecular weight: 97.99) were mixed to prepare a cerium oxide slurry (pH: 7) containing 5.0% by mass (solid content) of the cerium oxide particles. The mixing amount of the ammonium dihydrogen phosphate was adjusted to 1% by mass on the basis of the total amount of the cerium oxide particles.

An adequate amount of the cerium oxide slurry was introduced into trade name: MICROTRAC MT3300EXII manufactured by MicrotracBEL Corp., and the average particle diameter of cerium oxide particles was measured. The displayed average particle diameter value was obtained as the average particle diameter (average secondary particle diameter). The average particle diameter of cerium oxide particles in the cerium oxide slurry was 145 nm.

An adequate amount of the cerium oxide slurry was charged into trade name: DelsaNano C manufactured by Beckman Coulter, Inc. and measurement was performed twice at 25° C. The average value of the displayed zeta potentials was obtained as the zeta potential. The zeta potential of the cerium oxide particles in the cerium oxide slurry was −55 mV.

<Preparation of Cerium Hydroxide Slurry>

(Synthesis of Cerium Hydroxide)

480 g of an aqueous 50% by mass $Ce(NH_4)_2(NO_3)_6$ solution (trade name: CAN50 liquid manufactured by Nihon Kagaku Sangyo Co., Ltd.) was mixed with 7450 g of pure water to obtain a solution. Next, while stirring this solution, 750 g of an aqueous imidazole solution (10% by mass aqueous solution, 1.47 mol/L) was added dropwise at a mixing rate of 5 mL/min to obtain a precipitate containing cerium hydroxide. The cerium hydroxide was synthesized at a temperature of 20° C. and a stirring speed of 500 min$^{-1}$ The stirring was carried out using a 3-blade pitch paddle with a total blade section length of 5 cm.

The obtained precipitate (precipitate containing cerium hydroxide) was subjected to centrifugal separation (4000 min$^{-1}$, for 5 minutes), and then subjected to solid-liquid separation with removal of a liquid phase by decantation. 10 g of particles obtained by solid-liquid separation and 990 g of water were mixed, and then the particles were dispersed in the water by using an ultrasonic cleaner to prepare a cerium hydroxide slurry (content of particles: 1.0% by mass) containing cerium hydroxide particles (second particles).

(Measurement of Average Particle Diameter)

When the average particle diameter (average secondary particle diameter) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion) containing 1.0% by mass of cerium hydroxide particles was poured in a 1-cm square cell, and then the cell was set in the N5. Measurement was performed at 25° C. with the refractive index set to 1.333 and the viscosity set to 0.887 mPa·s as the measuring sample information of N5 software, and the value displayed as Unimodal Size Mean was read off.

(Measurement of Zeta Potential)

An adequate amount of the cerium hydroxide slurry was charged into trade name: DelsaNano C manufactured by Beckman Coulter, Inc. and measurement was performed twice at 25° C. The average value of the displayed zeta potentials was obtained as the zeta potential. The zeta potential of cerium hydroxide particles in the cerium hydroxide slurry was +50 mV.

(Structural Analysis of Cerium Hydroxide Particles)

An adequate amount of the cerium hydroxide slurry was taken and vacuum dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Further, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Further, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

<Measurement of Absorbance and Light Transmittance of Supernatant Solution>

The absorbance and the light transmittance applied to the supernatant solution by the abrasive grains used in Examples described below were measured.

While stirring at a rotation speed of 300 rpm using a stirring blade of two blades, the cerium hydroxide slurry and deionized water were mixed to obtain a mixed liquid. Subsequently, after mixing the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.01% by mass) was prepared.

The content of the abrasive grains (the total amount of particles) in the test slurry was adjusted to 0.1% by mass (diluted with ion-exchange water) to prepare a test liquid. 7.5 g of the test liquid was introduced in a centrifugal separator (trade name: Optima MAX-TL) manufactured by Beckman Coulter, Inc. and treated at a centrifugal acceleration of $5.8 \times 10^4$ G and at a setting temperature of 25° C. for 5 minutes to obtain a supernatant solution.

About 4 mL of the supernatant solution was introduced into a 1-cm square cell made of quartz, and then, the cell was placed in a spectrophotometer (device name: U3310) manufactured by Hitachi, Ltd. Measurement of the absorbance was performed in a wavelength range of 200 to 600 nm, and a value of the absorbance in a wavelength of 380 nm was read from a chart thus obtained. The absorbance was 0.002. Further, a value of the light transmittance in a wavelength of 500 nm was read from the chart thus obtained, and as a result, the value was 92%/cm or more.

Preparation of Polishing Liquid for CMP

Example 1

While stirring at a rotation speed of 300 rpm using a stirring blade of two blades, 20 g of the cerium hydroxide slurry and 1940 g of deionized water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Subsequently, a hydroxy acid (2,2-bis(hydroxymethyl)butyric acid), a polyol (trade name: TMP-60 manufactured by NIPPON NYUKAZAI CO., LTD., polyoxyethylene trimethylolpropane ether), a glycine (aminocarboxylic acid, pI=5.97), and deionized water were mixed. Thereby, a polishing liquid for CMP containing 0.18% by mass of the abrasive grains, 0.10% by mass of the hydroxy acid, 0.50% by mass of the polyol, and 0.10% by mass of the glycine on the basis of the total mass of the polishing liquid for CMP was obtained. As the abrasive grains, the polishing liquid for CMP contained composite particles including cerium oxide particles and cerium hydroxide particles that were in contact with the cerium oxide particles, and the mass ratio between the cerium oxide particles and the cerium hydroxide particles was 10:1 (cerium oxide:cerium hydroxide). The polishing liquid for CMP contained cerium hydroxide particles (free particles) that were not in contact with the cerium oxide particles as the abrasive grains, in addition to the above-described composite particles.

Examples 2 to 5

Polishing liquids for CMP were prepared in the same manner as in Example 1, except that the glycine was changed to an aminocarboxylic acid described in Table 1.

Example 6

A polishing liquid for CMP was prepared in the same manner as in Example 1, except that 2,2-bis(hydroxymethyl) butyric acid was changed to 2,2-bis(hydroxymethyl)propionic acid.

Example 7

A polishing liquid for CMP was prepared in the same manner as in Example 6, except that polyoxyethylene trimethylolpropane ether was changed to pentaerythritol polyoxyethylene ether (trade name: PNT-40 manufactured by NIPPON NYUKAZAI CO., LTD.).

Example 8

A polishing liquid for CMP was prepared in the same manner as in Example 6, except that polyoxyethylene trimethylolpropane ether was changed to polyethylene glycol (PEG4000 manufactured by NOF CORPORATION, weight average molecular weight: 4000).

Example 9

A polishing liquid for CMP was prepared in the same manner as in Example 1, except that the hydroxy acid was changed to DL-lactic acid.

Example 10

A polishing liquid for CMP was prepared in the same manner as in Example 1, except that the hydroxy acid was changed to DL-glyceric acid.

Comparative Examples 1 and 2

Polishing liquids for CMP were prepared in the same manner as in Example 1, except that the aminocarboxylic acid was changed to arginine (pI=10.76) or histidine (pI=7.59).

Comparative Example 3

A polishing liquid for CMP was prepared in the same manner as in Example 1, except that the polyol was not used (the amount of deionized water was increased).

Comparative Example 4

A polishing liquid for CMP was prepared in the same manner as in Example 1, except that the hydroxy acid was not used (the amount of deionized water was increased).

Examples 11 to 13

Polishing liquids for CMP were prepared in the same manner as in Example 1, except that the glycine was changed to an aminosulfonic acid described in Table 4.

Example 14

A polishing liquid for CMP was prepared in the same manner as in Example 11, except that the hydroxy acid was changed to DL-lactic acid.

Example 15

A polishing liquid for CMP was prepared in the same manner as in Example 11, except that the hydroxy acid was changed to DL-glyceric acid.

Comparative Example 5

Polishing liquids for CMP were prepared in the same manner as in Example 1, except that the glycine was changed to p-toluenesulfonic acid (pKa=−2.80).

<Zeta Potential of Abrasive Grains>

An adequate amount of the polishing liquid for CMP was charged into trade name: DelsaNano C manufactured by Beckman Coulter, Inc. and measurement was performed twice at 25° C. The average value of the displayed zeta potentials was obtained as the zeta potential. As a result, the zeta potential of the abrasive grains was +55 mV.

<Average Particle Diameter of Abrasive Grains>

An appropriate amount of the polishing liquid for CMP was introduced into trade name: Microtrac MT3300EXII manufactured by MicrotracBEL Corp., and the average particle diameter of the abrasive grains was measured. The displayed average particle diameter value was obtained as the average particle diameter (average secondary particle diameter). The average particle diameter of the abrasive grains in the polishing liquid for CMP was 155 nm.

<pH of Polishing Liquid for CMP>

The pH of the polishing liquid for CMP was evaluated under the following conditions. The results are shown in Table 1 to Table 4.

Measurement temperature: 25° C.

Measurement apparatus: Model No. PHL-40 manufactured by DKK-TOA CORPORATION

Measurement method: after performing 2-point calibration using a standard buffer solution (phthalate pH buffer solution, pH: 4.01 (25° C.); neutral phosphate pH buffer solution, pH: 6.86 (25° C.)), an electrode was placed in the polishing liquid for CMP for 2 minutes or longer, and pH after stabilization was measured with the measurement apparatus above.

<CMP Evaluation>

The substrate to be polished was polished using the polishing liquid for CMP under the following polishing conditions.

Polishing apparatus: MIRRA-3400 (manufactured by Applied Materials, Inc.)

Flow rate of polishing liquid for CMP: 250 mL/min

Substrate to be polished: Blanket wafer and pattern wafer described below

Polishing pad: Foamed polyurethane having closed pores (Model No. IC1010 manufactured by ROHM AND HAAS ELECTRONIC MATERIALS CMP INC.), Polishing pressure: 2.0 psi Number of rotations of substrate to be polished and polishing platen: Substrate to be polished/polishing platen=90/87 rpm Polishing time:

(Blanket wafer) 1 min (Pattern wafer) A wafer described below in which polishing was performed until the silicon nitride film was exposed was additionally polished (over-polished) using the above-described polishing liquid for CMP by the polished amounts of 20 nm and 40 nm. The remaining step height (dishing) and the polished amount of the silicon nitride film at this time was checked.

Washing of wafer: After a CMP treatment, washing was performed with water while applying an ultrasonic wave, and then drying was performed with a spin dryer.

[Blanket Wafer]

As a blanket wafer, a substrate to be polished having a silicon oxide film having a thickness of 2 μm, which had been formed by a plasma CVD method, on a silicon substrate was used.

[Pattern Wafer]

As a pattern wafer with a simulated pattern formed, 764 wafer (trade name, diameter: 300 mm) manufactured by SEMATECH was used. The pattern wafer was a wafer obtained by stacking a silicon nitride film as a stopper (stopper film) on a silicon substrate, then forming a trench in an exposure step, and stacking a silicon oxide film ($SiO_2$ film) as an insulating film on the silicon substrate and the silicon nitride film to fill the stopper and the trench. The silicon oxide film was formed by an HDP (high density plasma) method.

As the above-described pattern wafer, a wafer having a part with a line (convex portion) and a space (concave portion) having a pitch of 100 μm and a convex pattern density of 50% was used. The line and space is a simulated pattern, and is a pattern in which an Active portion masked by the stopper film as the convex portion and a Trench portion with a groove formed as the concave portion are alternately arranged. For example, the phrase "a line and space having a pitch of 100 µm" means that the total of the widths of a line portion and a space portion is 100 µm. Further, for example, the phrase "a line and space having a pitch of 100 µm and a convex pattern density of 50%" means a pattern in which a convex portion having a convex width of 50 µm and a concave portion having a concave width of 50 µm are alternately arranged.

In the polishing evaluation of the pattern wafer, a wafer in which the remaining step height becomes about 30 nm by polishing the above-described wafer by using a known polishing liquid for CMP having self-stopping property (property of reducing the polishing rate in accordance with a decrease in the remaining step height in the simulated pattern) was used. Specifically, a wafer, which was polished until the silicon nitride film in the convex portion in a pitch of 100 µm and a pattern density of 50% was exposed using a polishing liquid in which HS-8005-D4 (trade name) manufactured by Hitachi Chemical Company, Ltd., HS-7303GP (trade name) manufactured by Hitachi Chemical Company, Ltd., and water were blended in a ratio of 1:1.2:7.8, was used.

[Evaluation of Blanket Wafer (Polishing Rate)]

Regarding the substrate to be polished which had been polished and washed under the above-described condition, the polishing rate for the film to be polished (silicon oxide film) was obtained by the following formula. Incidentally, the film thickness difference of each film to be polished before and after polishing was determined using a light interference type film thickness measuring apparatus (manufactured by Filmetrics Japan, Inc., trade name: F80). The measurement results are shown in Table 1 to Table 4.

Polishing rate (RR)=(Film thickness difference (nm) of each film to be polished before and after polishing)/(Polishing time (min))

[Evaluation of Pattern Wafer]

The remaining film thicknesses of the silicon nitride film of the convex portion and the remaining film thicknesses of the silicon oxide film of the concave portion of the pattern wafer which had been polished and washed under the above-described condition were measured to obtain a remaining step height by using the following formula. In the formula, "350 nm+Remaining film thicknesses (nm) of silicon nitride film" represents a film thickness of the convex portion. Further, the polished amount of the silicon nitride film was obtained using a difference between the initial thickness of the silicon nitride film and the thickness of the silicon nitride film after polishing (remaining film thicknesses) by the following formula. Incidentally, the thicknesses of each film to be polished before and after polishing were determined using a light interference type film thickness measuring apparatus (trade name: Nanospec AFT-5100 manufactured by Nanometrics Incorporated). The measurement results are shown in Table 1 to Table 4.

Remaining step height=(350 nm+Remaining film thicknesses (nm) of silicon nitride film)−(Remaining film thicknesses (nm) of silicon oxide film of concave portion)

Polished amount of silicon nitride film=1500 nm−Remaining film thicknesses (nm) of silicon nitride film of convex portion

TABLE 1

| | | Example | | | | |
| --- | --- | --- | --- | --- | --- | --- |
| | | 1 | 2 | 3 | 4 | 5 |
| Hydroxy acid | Type | 2,2-Bis(hydroxymethyl)butyric acid | | | | |
| | Mixing amount (mass %) | 0.10 | | | | |
| Polyol | Type | TMP-60 | | | | |
| | Mixing amount (mass %) | 0.50 | | | | |
| Aminocarboxylic acid | Type | Glycine | Serine | Cysteine | Glutamine | Glutamic acid |
| | pKa | 2.35 | 2.19 | 1.92 | 2.17 | 2.10 |
| | Isoelectric point | 5.97 | 5.68 | 5.07 | 5.65 | 3.22 |
| | Mixing amount (mass %) | 0.10 | | | | |
| pH of polishing liquid | | 3.6 | 3.5 | 3.3 | 3.5 | 3.1 |
| Polishing rate (nm/min) | | 136 | 98 | 101 | 103 | 81 |
| Pattern wafer evaluation (pitch: 100 µm, density 50%) | Polished amount (nm) | 20  40 | 20  40 | 20  40 | 20  40 | 20  40 |
| | Remaining step height (dishing) (nm) | 8  14 | 7  12 | 9  15 | 9  14 | 4  9 |
| | Polished amount (nm) of silicon nitride film | 5  9 | 4  10 | 3  8 | 6  12 | 3  5 |

TABLE 2

|  |  | Example | | | | |
|---|---|---|---|---|---|---|
|  |  | 6 | 7 | 8 | 9 | 10 |
| Hydroxy acid | Type | 2,2-Bis(hydroxymethyl)propionic acid | | | DL-lactic acid | DL-glyceric acid |
|  | Mixing amount (mass %) | | | 0.10 | | |
| Polyol | Type | TMP-60 | PNT-40 | PEG4000 | TMP-60 | |
|  | Mixing amount (mass %) | | | 0.50 | | |
| Aminocarboxylic acid | Type | | | Glycine | | |
|  | pKa | | | 2.35 | | |
|  | Isoelectric point | | | 5.97 | | |
|  | Mixing amount (mass %) | | | 0.10 | | |
| pH of polishing liquid | | 3.6 | 3.6 | 3.6 | 3.2 | 3.6 |
| Polishing rate (nm/min) | | 158 | 138 | 125 | 448 | 296 |
| Pattern wafer evaluation (pitch: 100 μm, density: 50%) | Polished amount (nm) | 20  40 | 20  40 | 20  40 | 20  40 | 20  40 |
|  | Remaining step height (dishing) (nm) | 9  18 | 8  15 | 6  12 | 10  19 | 12  24 |
|  | Polished amount (nm) of silicon nitride film | 6  11 | 6  10 | 5  10 | 7  12 | 10  21 |

TABLE 3

|  |  | Comparative Example | | | |
|---|---|---|---|---|---|
|  |  | 1 | 2 | 3 | 4 |
| Hydroxy acid | Type | 2,2-Bis(hydroxymethyl)butyric acid | | | — |
|  | Mixing amount (mass %) | 0.10 | | | — |
| Polyol | Type | TMP-60 | | — | TMP-60 |
|  | Mixing amount (mass %) | 0.50 | | — | 0.50 |
| Aminocarboxylic acid | Type | Arginine | Histidine | Glycine | |
|  | pKa | 1.82 | 1.80 | 2.35 | |
|  | Isoelectric point | 10.76 | 7.59 | 5.97 | |
|  | Mixing amount (mass %) | | | 0.10 | |
| pH of polishing liquid | | 4.8 | 4.2 | 3.6 | 4.5 |
| Polishing rate (nm/min) | | 225 | 208 | 144 | 445 |
| Pattern wafer evaluation (pitch: 100 μm, density: 50%) | Polished amount (nm) | 20  40 | 20  40 | 20  40 | 20  40 |
|  | Remaining step height (dishing) (nm) | 21  58 | 17  42 | 15  28 | 25  45 |
|  | Polished amount (nm) of silicon nitride film | 12  28 | 10  21 | 7  14 | 18  32 |

TABLE 4

|  |  | Example | | | | | Comparative Example |
|---|---|---|---|---|---|---|---|
|  |  | 11 | 12 | 13 | 14 | 15 | 5 |
| Hydroxy acid | Type | 2,2-Bis(hydroxymethyl)butyric acid | | | DL-lactic acid | DL-glyceric acid | 2,2-Bis(hydroxymethyl)butyric acid |
|  | Mixing amount (mass %) | | | | 0.10 | | |
| Polyol | Type | | | | TMP-60 | | |
|  | Mixing amount (mass %) | | | | 0.50 | | |
| Aminosulfonic acid | Type | Sulfamic acid | Aminoethanesulfonic acid | Sulfamic acid | | Sulfamic acid | p-Toluenesulfonic acid |
|  | pKa | 0.99 | 1.50 | 3.01 | | 0.99 | −2.80 |
|  | Mixing amount (mass %) | | | 0.10 | | | |

TABLE 4-continued

|  |  | Example | | | | | | | | | | Comparative Example | |
|---|---|---|---|---|---|---|---|---|---|---|---|---|---|
|  |  | 11 | | 12 | | 13 | | 14 | | 15 | | 5 | |
| pH of polishing liquid | | 2.5 | | 3.1 | | 2.7 | | 2.1 | | 2.4 | | 1.8 | |
| Polishing rate (nm/min) | | 68 | | 115 | | 79 | | 72 | | 58 | | 18 | |
| Pattern wafer evaluation (pitch: 100 μm, density: 50%) | Polished amount (nm) | 20 | 40 | 20 | 40 | 20 | 40 | 20 | 40 | 20 | 40 | 20 | 40 |
|  | Remaining step height (dishing) (nm) | 8 | 12 | 10 | 17 | 8 | 15 | 9 | 17 | 10 | 18 | 15 | 26 |
|  | Polished amount (nm) of silicon nitride film | 3 | 10 | 5 | 12 | 4 | 10 | 4 | 10 | 5 | 12 | 11 | 21 |

The invention claimed is:

1. A polishing liquid comprising: abrasive grains; a hydroxy acid component; a polyol component; at least one zwitterionic compound selected from the group consisting of an aminocarboxylic acid and an aminosulfonic acid; and a liquid medium, wherein
a zeta potential of the abrasive grains is positive,
the hydroxy acid component comprises a hydroxy acid having a quaternary carbon atom,
the polyol component comprises polyether polyol including a polyoxyalkylene group,
an isoelectric point of the aminocarboxylic acid is smaller than 7.0, and
pKa of the aminosulfonic acid is larger than 0.

2. The polishing liquid according to claim 1, wherein the abrasive grains include a property of producing a liquid phase having an absorbance of more than 0 for light having a wavelength of 380 nm when an aqueous dispersion having a content of the abrasive grains adjusted to 1.0% by mass is subjected to centrifugal separation at a centrifugal acceleration of $5.8 \times 10^4$ G for five minutes.

3. The polishing liquid according to claim 1, wherein the number of hydroxyl groups of the hydroxy acid is 2.

4. The polishing liquid according to claim 1, wherein a content of the hydroxy acid component is 0.01 to 1.0% by mass.

5. The polishing liquid according to claim 1, wherein the polyether polyol has the number of hydroxyl groups of 3 or more.

6. The polishing liquid according to claim 1, wherein a content of the polyol component is 0.05 to 5.0% by mass.

7. The polishing liquid according to claim 1, wherein the at least one zwitterionic compound comprises an aminocarboxylic acid.

8. The polishing liquid according to claim 1, wherein the at least one zwitterionic compound comprises an aminosulfonic acid.

9. The polishing liquid according to claim 1, wherein a content of the at least one zwitterionic compound is 0.01 to 1.0% by mass.

10. The polishing liquid according to claim 1, wherein the hydroxy acid has-a carbon atom to which a plurality of hydroxyalkyl groups are bonded.

11. The polishing liquid according to claim 1, wherein the hydroxy acid component comprises at least one selected from the group consisting of 2,2-bis(hydroxymethyl)propionic acid and 2,2-bis(hydroxymethyl)butyric acid.

12. The polishing liquid according to claim 1, wherein the polyol component comprises at least one selected from the group consisting of a polyoxyalkylene trimethylolpropane ether and a pentaerythritol polyoxyalkylene ether.

13. A polishing liquid set comprising:
constituent components of the polishing liquid according to claim 1, separately stored as a first liquid and a second liquid, wherein
the first liquid comprises the abrasive grains and the liquid medium, and
the second liquid comprises the hydroxy acid component, the polyol component, the at least one zwitterionic compound, and the liquid medium.

14. A polishing method comprising a polishing step of polishing a surface to be polished by using the polishing liquid according to claim 1.

15. The polishing method according to claim 14, wherein the surface to be polished comprises silicon oxide.

16. The polishing method according to claim 15, wherein the surface to be polished further comprises silicon nitride, and
the silicon oxide is selectively polished with respect to the silicon nitride in the polishing step.

17. A polishing method comprising a polishing step of polishing a surface to be polished by using the polishing liquid obtained by mixing the first liquid and the second liquid of the polishing liquid set according to claim 13.

18. The polishing method according to claim 17, wherein the surface to be polished comprises silicon oxide.

19. The polishing method according to claim 18, wherein the surface to be polished further comprises silicon nitride, and
the silicon oxide is selectively polished with respect to the silicon nitride in the polishing step.

* * * * *